US011636909B2

(12) United States Patent
Kim et al.

(10) Patent No.: US 11,636,909 B2
(45) Date of Patent: Apr. 25, 2023

(54) MEMORY DEVICE AND MEMORY SYSTEM CONTROLLING GENERATION OF DATA STROBE SIGNAL BASED ON EXECUTING A TEST

(71) Applicant: SK hynix Inc., Icheon-si (KR)

(72) Inventors: Hyun Seung Kim, Icheon-si (KR); Hyeong Soo Jeong, Icheon-si (KR)

(73) Assignee: SK hynix Inc., Icheon-si (KR)

(*) Notice: Subject to any disclaimer, the term of this patent is extended or adjusted under 35 U.S.C. 154(b) by 140 days.

(21) Appl. No.: 17/313,494

(22) Filed: May 6, 2021

(65) Prior Publication Data

US 2022/0262448 A1    Aug. 18, 2022

(30) Foreign Application Priority Data

Feb. 18, 2021    (KR) .................. 10-2021-0022195

(51) Int. Cl.
| | |
|---|---|
| G11C 29/14 | (2006.01) |
| G11C 29/10 | (2006.01) |
| G11C 29/44 | (2006.01) |
| G11C 29/56 | (2006.01) |
| G11C 7/10 | (2006.01) |
| G11C 8/18 | (2006.01) |
| G11C 29/36 | (2006.01) |

(52) U.S. Cl.
CPC ............ *G11C 29/14* (2013.01); *G11C 7/1012* (2013.01); *G11C 7/1057* (2013.01); *G11C 7/1063* (2013.01); *G11C 8/18* (2013.01); *G11C 29/10* (2013.01); *G11C 29/44* (2013.01); *G11C 29/56* (2013.01); *G11C 2029/3602* (2013.01)

(58) Field of Classification Search
None
See application file for complete search history.

(56) References Cited

U.S. PATENT DOCUMENTS

| | | | | |
|---|---|---|---|---|
| 2005/0271179 A1* | 12/2005 | Hasegawa | ........ | G01R 31/31922 375/371 |
| 2008/0046788 A1* | 2/2008 | Lee | ......................... | G11C 29/14 714/718 |
| 2009/0228747 A1* | 9/2009 | Kim | ......................... | G11C 29/26 714/704 |
| 2009/0259895 A1* | 10/2009 | Jung | ....................... | G11C 29/28 714/718 |
| 2014/0022836 A1* | 1/2014 | Kim | .................... | G11C 11/1675 365/158 |
| 2015/0012791 A1* | 1/2015 | Kim | ....................... | G11C 29/36 714/744 |

FOREIGN PATENT DOCUMENTS

KR          102077072 B1     2/2020

\* cited by examiner

*Primary Examiner* — J. H. Hur
(74) *Attorney, Agent, or Firm* — William Park & Associates Ltd.

(57) ABSTRACT

A memory device includes a data storage circuit configured to store, when a write operation is performed, a first internal write data and a second internal write data in a memory cell array which is accessed by an internal address, and output, when a read operation is performed, data stored in a memory cell array which is accessed by the internal address, as internal read data; and a flag generation circuit configured to generate a flag for controlling generation of a data strobe signal, based on the internal read data.

9 Claims, 8 Drawing Sheets

MEMORY DEVICE AND MEMORY SYSTEM CONTROLLING GENERATION OF DATA STROBE SIGNAL BASED ON EXECUTING A TEST

CROSS-REFERENCE TO RELATED APPLICATION

The present application claims priority under 35 U.S.C. § 119(a) to Korean Patent Application No. 10-2021-0022195 filed on Feb. 18, 2021 in the Korean intellectual Property Office, which is incorporated herein by reference in its entirety.

BACKGROUND

1. Technical Field

Embodiments of the disclosure may generally relate to a memory device and memory system for executing a test.

2. Related Art

A memory system including a memory device and so on executes various tests for verifying failures occurred during a process. Recently, as the fabrication process of the memory device is further refined, the number of occurred failures is increasing, and the number of tests required to verify such increasing failures is also increasing.

SUMMARY

In an embodiment, a memory device may include: a data input circuit configured to generate first internal write data and second internal write data by receiving first write data when a write operation is performed in a test operation; a data storage circuit configured to store, when the write operation is performed, the first internal write data and the second internal write data in a memory cell array which is accessed by an internal address, and output, when a read operation is performed, data stored in a memory cell array which is accessed by the internal address, as internal read data; and a flag generation circuit configured to generate a flag for controlling generation of a data strobe signal, based on the internal read data.

In an embodiment, a memory device may include: a data storage circuit configured to store, when a write operation is performed in a test operation, first internal write data and second internal write data, generated from first write data, in a memory cell array which is accessed by an internal address, and output, when a read operation is performed, data stored in a memory cell array which is accessed by the internal address, as internal read data; and a flag generation circuit configured to generate a flag for controlling generation of a data strobe signal, based on the internal read data.

In an embodiment, a memory system may include: an external device configured to apply a command, an address and first write data, and receive read data and a data strobe signal; and a memory device configured to store, when a write operation is performed in a test operation, first internal write data and second internal write data generated from the first write data, output internal read data as the read data when a read operation is performed, and control generation of the data strobe signal depending on whether logic levels of bits included in the internal read data are the same.

DETAILED DESCRIPTION

In the description of the following embodiments, the term "preset" means that the numerical value of a parameter is determined in advance when the parameter is used in a process or algorithm. Depending on an embodiment, the numerical value of a parameter may be set when a process or algorithm starts or may be set during a period in which the process or algorithm is executed.

Terms such as "first" and "second" used to distinguish various components are not limited by components. For example, a first component may be named a second component, and conversely, the second component may be named the first component.

When it is described that one component is "coupled" or "connected" to another component, it is to be understood that the one component may be coupled or connected to the another component directly or by the medium of still another component. On the other hand, the descriptions of "directly coupled" or "directly connected" should be understood to mean that one component is coupled or connected to another component directly without intervention of a still another component.

"Logic high level" and "logic low level" are used to describe logic levels of signals. A signal having a "logic high level" is distinguished from a signal having a "logic low level." For example, when a signal having a first voltage corresponds to a signal having a "logic high level," a signal having a second voltage may correspond to a signal having a "logic low level." According to an example, a "logic high level" may be set to a voltage higher than a "logic low level." Meanwhile, depending on an embodiment, logic levels of signals may be set to different logic levels or opposite logic levels. For example, depending on an embodiment, a signal having a logic high level may be set to have a logic low level, and a signal having a logic low level may be set to have a logic high level.

Hereinafter, various examples of embodiments of the disclosure will be described in detail with reference to the accompanying drawings. These embodiments are only for illustrating the disclosure, and the scope of protection of the disclosure is not limited by these embodiments.

Various embodiments are directed to a memory device and memory system for executing a test.

According to the disclosure, when a test for checking a failure of a memory device is executed by sequentially performing a write operation and a read operation, a data strobe signal the generation of which is controlled depending on whether the memory device has a failure is generated, whereby it is possible to easily check whether the memory device has a failure, through the data strobe signal.

Also, according to the disclosure, a plurality of internal write data to be stored in a data storage circuit are generated using write data input through some data pads, whereby it may be possible to reduce the number of data pads used in a test executed to check whether the memory device has a failure.

Figure 1:
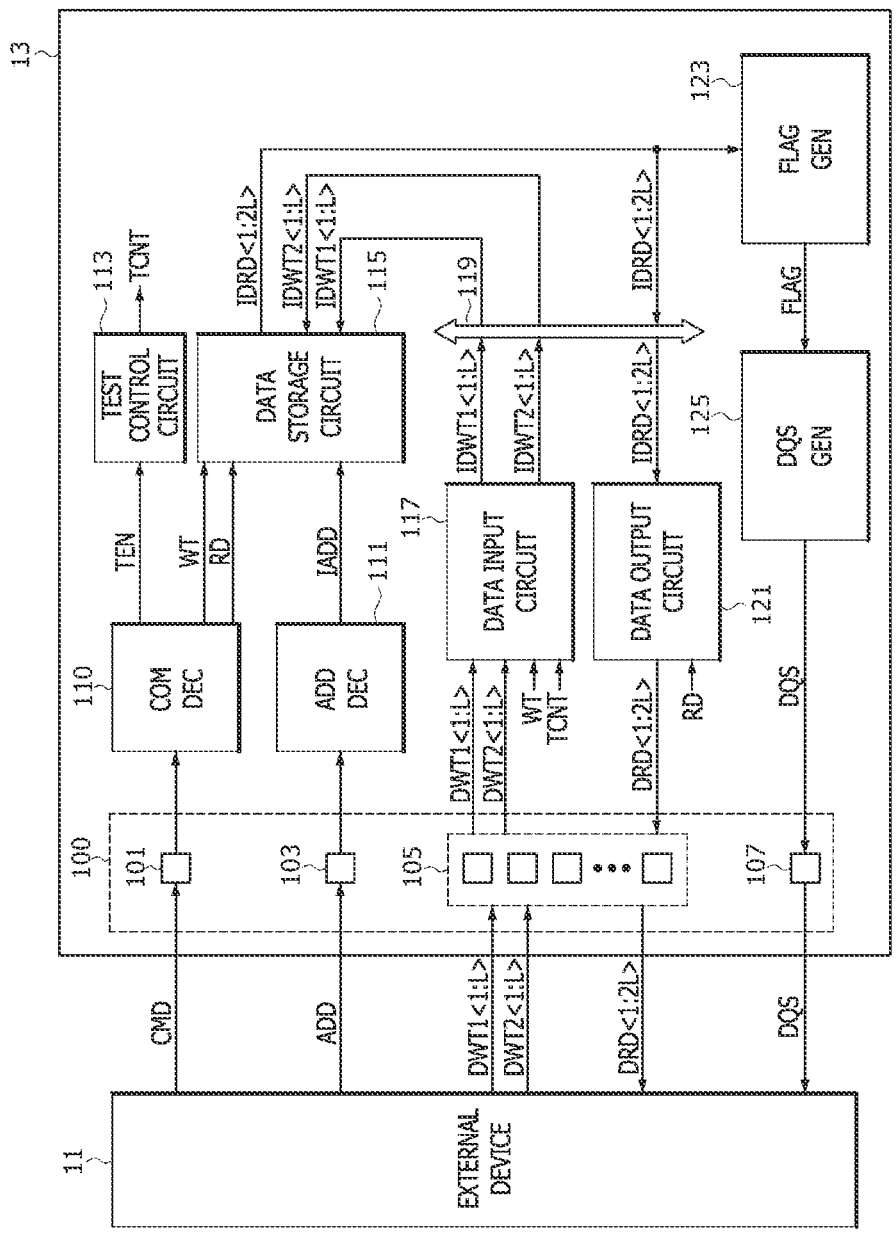
FIG. 1 is a block diagram illustrating a configuration of a memory system in accordance with an embodiment of the disclosure.

As illustrated in FIG. 1, a memory system in accordance with an embodiment of the disclosure may include an external device (EXTERNAL DEVICE) 11 and a memory device (MEMORY DEVICE) 13. The memory device 13 may include an input circuit 100, a command decoder (COM DEC) 110, an address decoder (ADD DEC) 111, a test control circuit 113, a data storage circuit 115, a data input circuit 117, a data line 119, a data output circuit 121, a flag generation circuit (FLAG GEN) 123 and a data strobe signal generation circuit (DQS GEN) 125. The input circuit 100 may include a command pad 101, an address pad 103, a data pad 105 and a data strobe pad 107. The data pad 105 may include an even number of pads. The data pad 105 may include a first pad part and a second pad part each of which includes a plurality of pads. The first pad part of the data pad 105 may include odd-numbered pads among the pads included in the data pad 105, and the second pad part of the data pad 105 may include even-numbered pads among the pads included in the data pad 105. For example, when four pads are included in the data pad 105, a first pad and a third pad included in the data pad 105 may be included in the first pad part of the data pad 105, and a second pad and a fourth pad included in the data pad 105 may be included in the second pad part of the data pad 105. A criterion for dividing the pads included in the data pad 105 into the first pad part and the second pad part may be variously set depending on an embodiment.

The external device 11 may apply a command CMD, an address ADD, first write data DWT1<1:L> and second write data DWT2<1:L> to the memory device 13, The memory device 13 may receive the command CMD, applied from the external device 11, through the command pad 101, The memory device 13 may receive the address ADD, applied from the external device 11, through the address pad 103. The memory device 13 may receive the first write data DWT1<1:L>, applied from the external device 11, through the first pad part of the data pad 105. The memory device 13 may receive the second write data DWT2<1:L>, applied from the external device 11, through the second pad part of the data pad 105. The external device 11 may receive read data DRD<1:2L> and a data strobe signal DQS from the memory device 13. The memory device 13 may output the read data DRD<1:2L> through the data pad 105 and thereby apply the read data DRD<1:2L> to the external device 11, The memory device 13 may output the data strobe signal DQS through the data strobe pad 107 and thereby apply the data strobe signal DQS to the external device 11. The external device 11 may be implemented as one of a memory controller and a test circuit. The external device 11 may check whether the memory device 13 has a failure, based on the data strobe signal DQS output from the memory device 13. The external device 11 may check whether the memory device 13 has a failure, by comparing the first write data DWT1<1:L> applied to the memory device 13 in a write operation and the read data DRD<1:2L> output from the memory device 13 in a read operation.

The command decoder 110 may receive the command CMD, applied from the external device 11, through the command pad 101, The command decoder 110 may generate a test activation signal TEN, a write signal WT and a read signal RD by decoding the command CMD. The command CMD may include a plurality of bits, and the number of bits included in the command CMD may be variously set depending on an embodiment. The command decoder 110 may generate the test activation signal TEN which is activated for a test operation, when the bits included in the command CMD are set as a first bit combination. The command decoder 110 may generate the write signal WT which is activated for the write operation, when the bits included in the command CMD are set as a second bit combination. The command decoder 110 may generate the read signal RD which is activated for the read operation, when the bits included in the command CMD are set as a third bit combination.

The address decoder 111 may receive the address ADD, applied from the external device 11, through the address pad 103. The address decoder 111 may generate an internal address IADD for accessing a memory cell array included in the data storage circuit 115, by decoding the address ADD. The internal address IADD may include a bank address, a row address and a column address. When memory cell arrays included in the data storage circuit 115 are divided into a plurality of banks, the bank address included in the internal address IADD may be generated to select at least one of the banks included in the data storage circuit 115. At least one among memory cell arrays included in a bank, selected by the bank address included in the internal address IADD, among the banks included in the data storage circuit 115 may be accessed by the row address and the column address included in the internal address IADD.

The test control circuit 113 may receive the test activation signal TEN from the command decoder 110. The test control circuit 113 may output a test control signal TCNT stored therein, based on the test activation signal TEN. The test control circuit 113 may output the test control signal TCNT which is stored in an activated state when the test activation signal TEN is activated as the test operation is performed. The test control circuit 113 may be implemented by a mode register, and may generate and store the activated test control signal TCNT based on a mode register write operation. The test control circuit 113 may be implemented in such a way to generate the test control signal TCNT based on information included in the command CMD and the address ADD in the mode register write operation. However, this is nothing but a mere example, and the disclosure is not limited thereto.

The data storage circuit 115 may receive the write signal WT and the read signal RD from the command decoder 110. The data storage circuit 115 may receive the internal address IADD from the address decoder 111. The data storage circuit 115 may receive first internal write data IDWT1<1:L> and second internal write data IDWT2<1:L> through the data line 119. When the activated write signal WT is received as the write operation is performed, the data storage circuit 115 may store the first internal write data IDWT1<1:L> and the second internal write data IDWT2<1:L> in a memory cell array accessed by the internal address IADD. When the activated read signal RD is received as the read operation is performed, the data storage circuit 115 may output data stored in a memory cell array accessed by the internal address IADD, as internal read data IDRD<1:2L>.

The data input circuit 117 may receive the first write data DWT1<1:L> and the second write data DWT2<1:L> through the data pad 105. The data input circuit 117 may generate the first internal write data IDWT1<1:L> and the second internal write data IDWT2<1:L> from the first write data DWT1<1:L> and the second write data DWT2<1:L> based on the write signal WT and the test control signal TCNT. When the activated write signal WT is input as the write operation is performed in a state in which the activated test control signal TCNT is input as the test operation is performed, the data input circuit 117 may generate the first internal write data IDWT1<1:L> and the second internal write data IDWT2<1:L> by buffering the first write data DWT1<1:L>. When the activated write signal WT is input as the write operation is performed in a state in which the inactivated test control signal TCNT is input as the test operation is not performed, the data input circuit 117 may generate the first internal write data IDWT1<1:L> by buffering the first write data DWT1<1:L> and generate the second internal write data IDWT2<1:L> by buffering the second write data DWT2<1:L>.

When the write operation is performed, the data line 119 may transfer the first internal write data IDWT1<1:L> and the second internal write data IDWT2<1:L>, generated by the data input circuit 117, to the data storage circuit 115. When the read operation is performed, the data line 119 may transfer the internal read data IDRD<1:2L>, output from the data storage circuit 115, to the data output circuit 121. The data line 119 may be implemented as a global input/output line. However, this is nothing but a mere example, and depending on an embodiment, the data line 119 may be implemented as various input/output lines.

The data output circuit 121 may receive the internal read data IDRD<1:2L> through the data line 119. The data output circuit 121 may generate the read data DRD<1:2L> from the internal read data IDRD<1:2L> based on the read signal RD. When the activated read signal RD is input as the read operation is performed, the data output circuit 121 may generate the read data DRD<1:2L> by buffering the internal read data IDRD<1:2L>.

When the read operation is performed, the flag generation circuit 123 may receive the internal read data IDRD<1:2L> output from the data storage circuit 115. The flag generation circuit 123 may generate a flag FLAG based on the internal read data IDRD<1:2L>. The flag generation circuit 123 may generate the flag FLAG which is activated, when all bits included in the internal read data IDRD<1:2L> are at the same logic level as one another. The flag generation circuit 123 may generate the flag FLAG which is inactivated, when at least one bit among the bits included in the internal read data IDRD<1:2L> is a different logic level than any other bit included in the internal read data IDRD<1:2L>. The flag generation circuit 123 may generate the flag FLAG which is inactivated to block an operation of generating the data strobe signal DQS which toggles, when the memory device 13 has a failure. Data all of which have the same logic level are stored in all the memory cell arrays included in the data storage circuit 115, by the write operation performed in the test operation, and thus, at least one of the bits included in the internal read data IDRD<1:2L> output from the data storage circuit 115 through the read operation when the memory device 13 has a failure may have a different logic level than any other bit included in the internal read data IDRD<1:2L>.

The data strobe signal generation circuit 125 may receive the flag FLAG from the flag generation circuit 123. The data strobe signal generation circuit 125 may control the generation of the data strobe signal DQS based on the flag FLAG. The data strobe signal generation circuit 125 may generate the data strobe signal DQS which toggles, in a state in which the flag FLAG is activated. The data strobe signal generation circuit 125 may prevent the operation of generating the data strobe signal DQS to toggle, in a state in which the flag FLAG is inactivated. In an embodiment, the data strobe signal generation circuit 125 may block the operation of generating the data strobe signal DQS, in a state in which the flag FLAG is inactivated. The data strobe signal DQS which is output from the data strobe signal generation circuit 125 may be set to not toggle and maintain a constant logic level in a state in which the flag FLAG is inactivated. In an embodiment, blocking the operation of generating the data strobe signal DQS or setting the data strobe signal DQS not to toggle and maintain a constant logic level may block read data DRD<1:2L> from being output from the memory device 13. In an embodiment, blocking the operation of generating the data strobe signal DQS or setting the data strobe signal DQS not to toggle and maintain a constant logic level may prevent the read data DRD<1:2L> from being received by the external device 11. However, this is nothing but a mere example, and the disclosure is not limited thereto.

Figure 2:
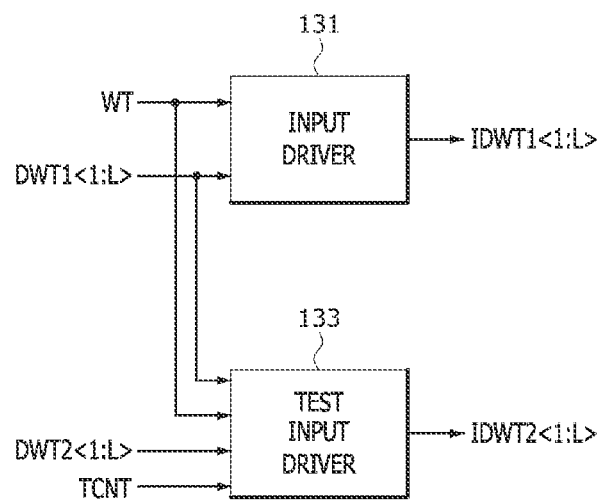
FIG. 2 is a block diagram illustrating a configuration of an embodiment of a data input circuit included in the memory system illustrated in FIG. 1.

As illustrated in FIG. 2, the data input circuit 117 may include an input driver 131 and a test input driver 133.

The input driver 131 may generate the first internal write data IDWT1<1:L> from the first write data DWT1<1:L> based on the write signal WT. When the activated write signal WT is received as the write operation is performed, the input driver 131 may generate the first internal write data IDWT1<1:L> by buffering the first write data DWT1<1:L>.

The test input driver 133 may generate the second internal write data IDWT2<1:L> from the first write data DWT1<1:L> and the second write data DWT2<1:L> based on the write signal WT and the test control signal TCNT. When the activated write signal WT is received as the write operation is performed in a state in which the activated test control signal TCNT is input as the test operation is performed, the test input driver 133 may generate the second internal write data IDWT2<1:L> by buffering the first write data DWT1<1:L>. When the activated write signal WT is received as the write operation is performed in a state in which the inactivated test control signal TCNT is input as the test operation is not performed, the test input driver 133 may generate the second internal write data IDWT2<1:L> by buffering the second write data DWT2<1:L>.

Figure 3:
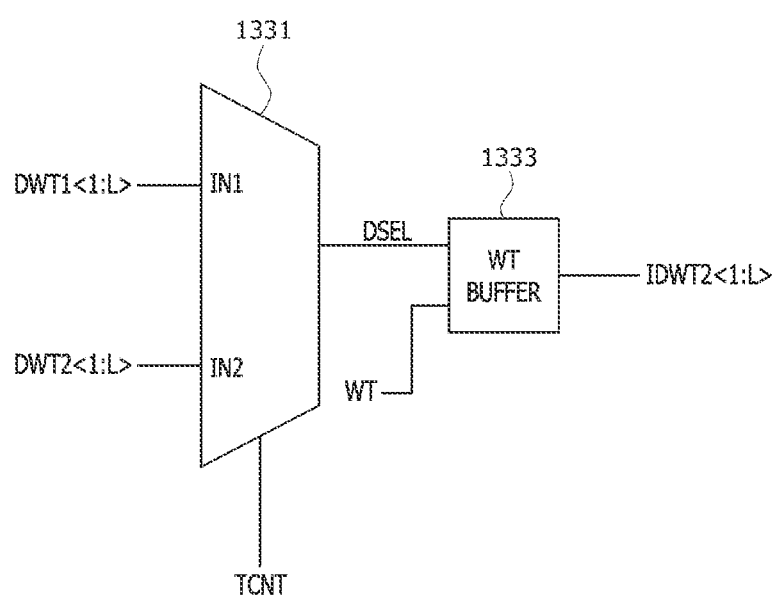
FIG. 3 is a circuit diagram illustrating an embodiment of a test input driver included in the data input circuit illustrated in FIG. 2.

As illustrated in FIG. 3, the test input driver 133 may include a multiplexer 1331 and a write buffer 1333.

The multiplexer 1331 may receive the first write data DWT1<1:L> through a first input terminal IN1 and receive the second write data DWT2<1:L> through a second input terminal IN2. The multiplexer 1331 may output the first write data DWT1<1; L> or the second write data DWT2<1:L> as selection data DSEL based on the test control signal TCNT. In a state in which the activated test control signal TCNT is input as the test operation is performed, the multiplexer 1331 may output the first write data DWT1<1:L> as the selection data DSEL. In a state in which the inactivated test control signal TCNT is input as the test operation is not performed, the multiplexer 1331 may output the second write data DWT2<1:L> as the selection data DSEL.

The write buffer 1333 may receive the selection data DSEL from the multiplexer 1331. The write buffer 1333 may generate the second internal write data IDWT2<1:L> from the selection data DSEL based on the write signal WT. When the activated write signal WT is received as the write operation is performed, the write buffer 1333 may generate the second internal write data IDWT2<1:L> by buffering the selection data DSEL.

Figure 4:
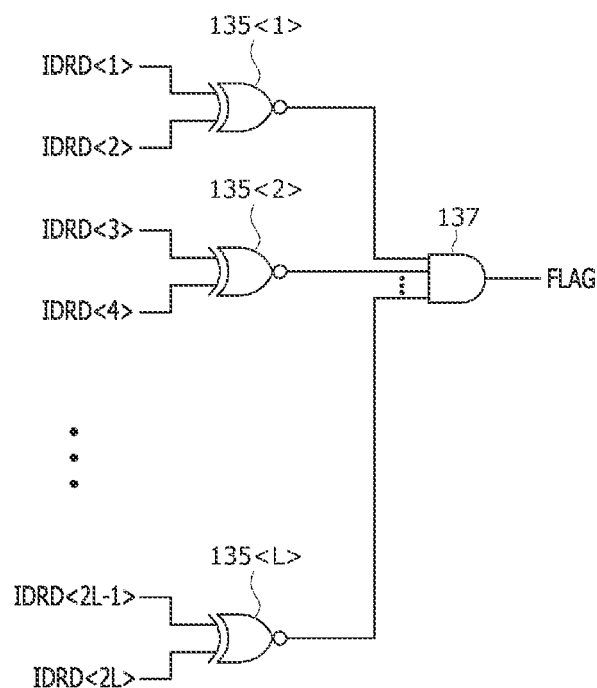
FIG. 4 is a circuit diagram illustrating an embodiment of a flag generation circuit included in the memory system illustrated in FIG. 1.

As illustrated in FIG. 4, the flag generation circuit 123 may include exclusive NOR gates 135<1> to 135<L> and an AND gate 137. The exclusive NOR gate 135<1> may receive the first bit IDRD<1> of the internal read data IDRD<1:2L> and the second bit IDRD<2> of the internal read data IDRD<1:2L>, and may perform an exclusive NOR operation thereon. The exclusive NOR gate 135<1> may output a logic high level when the first bit IDRD<1> of the internal read data IDRD<1:2L> and the second bit IDRD<2> of the internal read data IDRD<1:2L> are the same logic level. The exclusive NOR gate 135<1> may output a logic low level when the first bit IDRD<1> of the internal read data IDRD<1:2L> and the second bit IDRD<2> of the internal read data IDRD<1:2L> are different logic levels. The exclusive NOR gate 135<2> may receive the third bit IDRD<3> of the internal read data IDRD<1:2L> and the fourth bit IDRD<4> of the internal read data IDRD<1:2L>, and may perform an exclusive NOR operation thereon. The exclusive NOR gate 135<2> may output a logic high level when the third bit IDRD<3> of the internal read data IDRD<1:2L> and the fourth bit IDRD<4> of the internal read data IDRD<1:2L> are the same logic level. The exclusive NOR gate 135<2> may output a logic low level when the third bit IDRD<3> of the internal read data IDRD<1:2L> and the fourth bit IDRD<4> of the internal read data IDRD<1:2L> are different logic levels. The exclusive NOR gate 135<L> may receive the (2L−1)^th bit IDRD<2L−1> of the internal read data IDRD<1:2L> and the 2L^th bit IDRD<2L> of the internal read data IDRD<1:2L>, and may perform an exclusive NOR operation thereon. The exclusive NOR gate 135<L> may output a logic high level when the (2L−1)^th bit IDRD<2L−1> of the internal read data IDRD<1:2L> and the 2L^th bit IDRD<2L> of the internal read data IDRD<1:2L> are the same logic level. The exclusive NOR gate 135<L> may output a logic low level when the (2L−1)^th bit IDRD<2L−1> of the internal read data IDRD<1:2L> and the 2L^th bit IDRD<2L> of the internal read data IDRD<1:2L> are different logic levels. The AND gate 137 may generate the flag FLAG by receiving output signals of the exclusive NOR gates 135<1> to 135<L> and performing an AND operation thereon. The flag generation circuit 123 may generate the flag FLAG which is activated to a logic high level, when all the bits included in the internal read data IDRD<1:2L> are the same logic level. The flag generation circuit 123 may generate the flag FLAG which is inactivated to a logic low level, when at least one of the bits included in the internal read data IDRD<1:2L> is a different logic level.

FIGS. 5 to 8 are diagrams to assist in the explanation of the operation of the memory system illustrated in FIG. 1.

Figure 5:
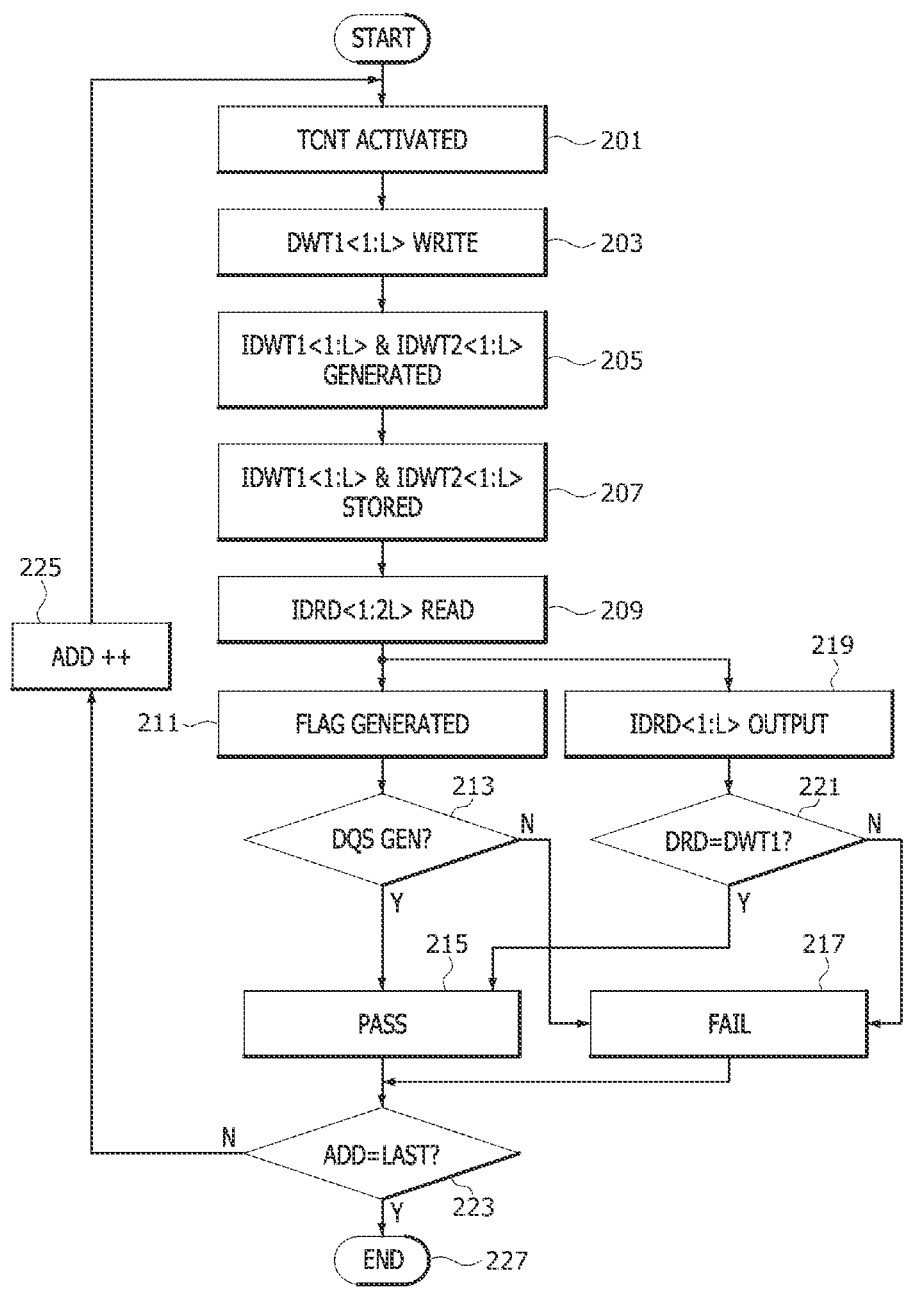
FIGS. 5, 6, 7, and 8 are diagrams to assist in the explanation of the operation of the memory system illustrated in FIG. 1.
Figure 6:
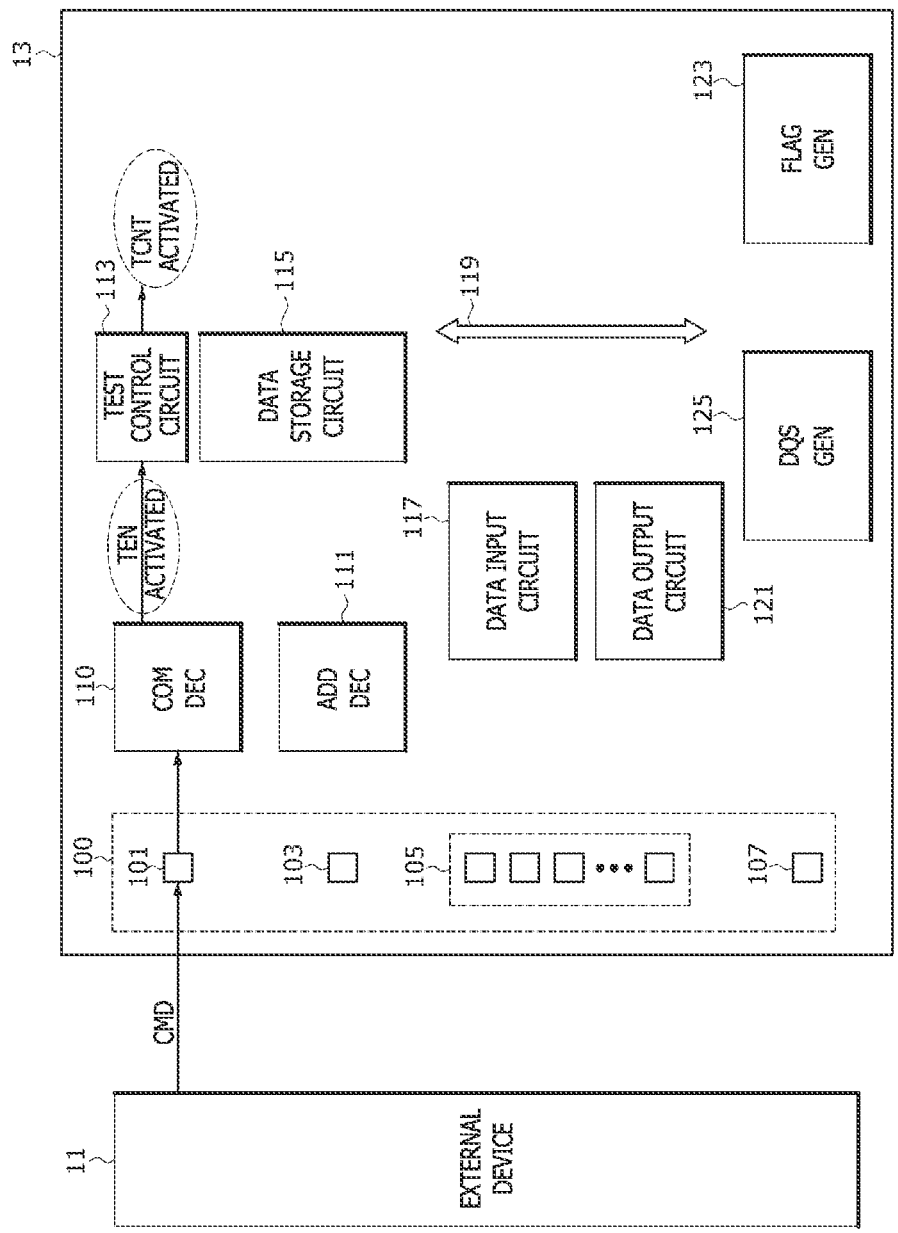

As illustrated in FIGS. 5 and 6, the command decoder 110 generates the test activation signal TEN which is activated for the test operation, by decoding the command CMD applied from the external device 11. The test control circuit 113 outputs the test control signal TCNT which is stored in an activated state when the test activation signal TEN is activated as the test operation is performed (201).

Figure 7:
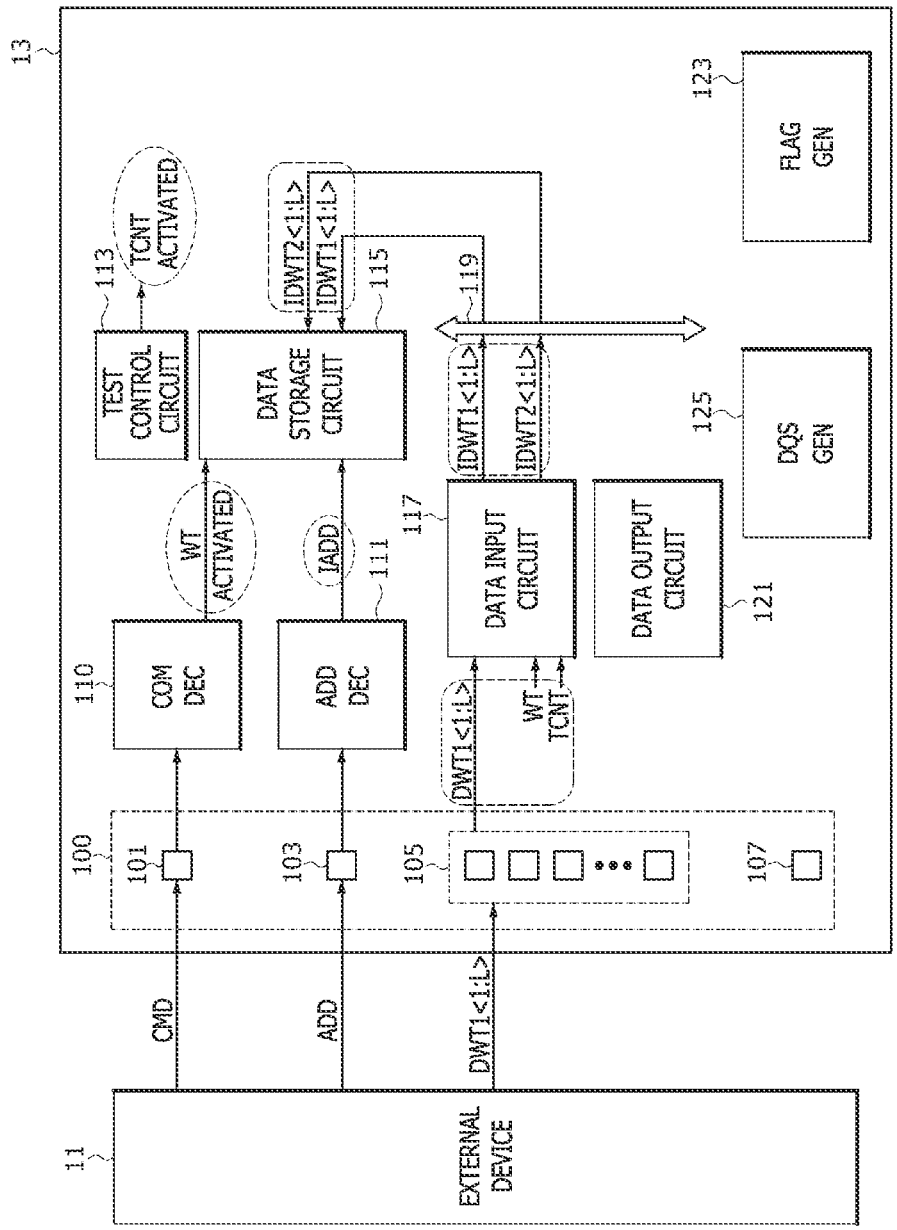

As illustrated in FIGS. 5 and 7, the command decoder 110 generates the write signal WT which is activated for the write operation, by decoding the command CMD applied from the external device 11, and the data input circuit 117 generates the first internal write data IDWT1<1:L> and the second internal write data IDWT2<1:L> by buffering the first write data DWT1<1:L> when the activated write signal WT is input as the write operation is performed in a state in which the activated test control signal TCNT is input as the test operation is performed (203 and 205). When the activated write signal WT is received as the write operation is performed, the data storage circuit 115 stores the first internal write data IDWT1<1:L> and the second internal write data IDWT2<1:L> in a memory cell array accessed by the internal address IADD (207).

Figure 8:
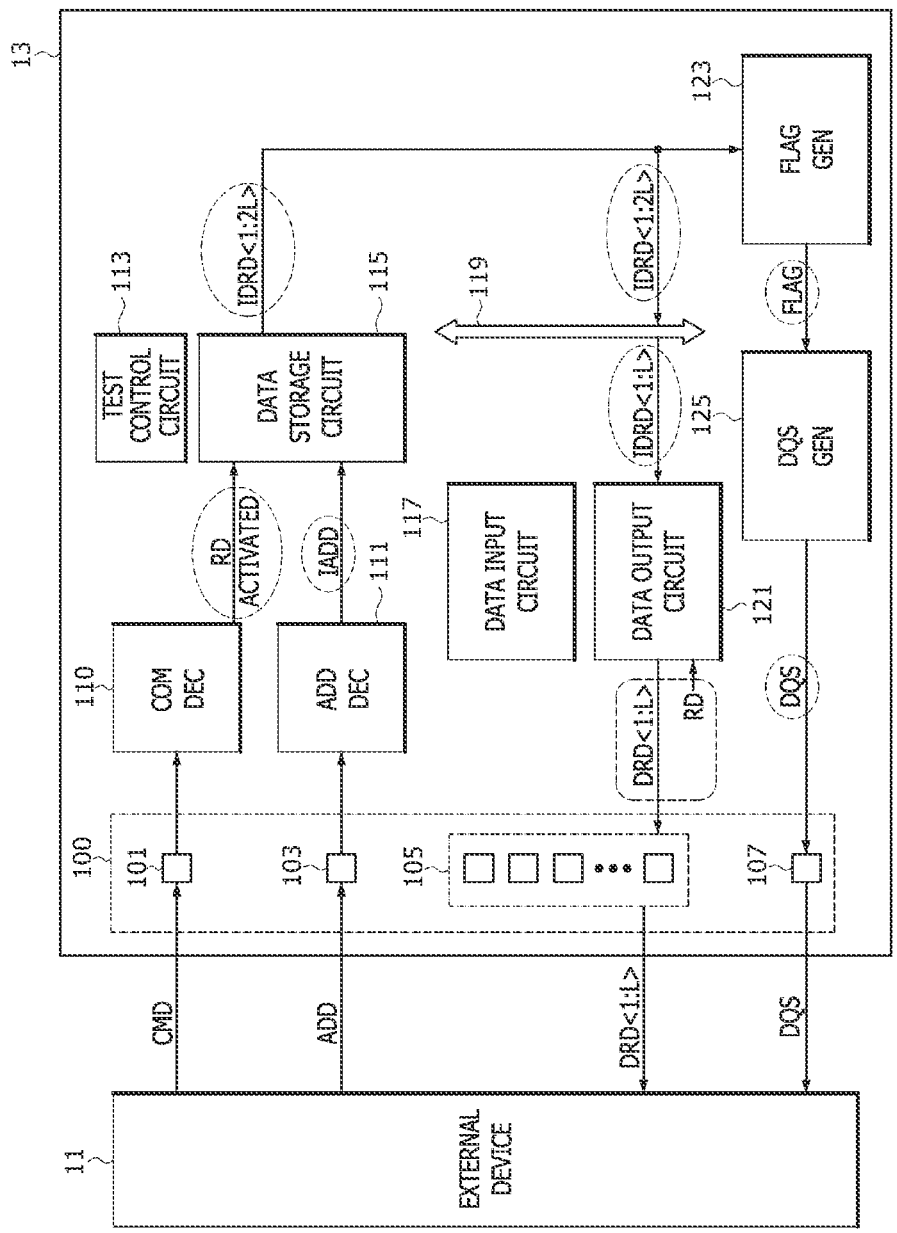

As illustrated in FIGS. 5 and 8, the command decoder 110 generates the read signal RD which is activated for the read operation, by decoding the command CMD applied from the external device 11, and, when the activated read signal RD is received as the read operation is performed, the data storage circuit 115 outputs data stored in a memory cell array accessed by the internal address IABD, as the internal read data IDRD<1:2L> (209).

As illustrated in FIGS. 5 and 8, the flag generation circuit 123 generates the flag FLAG based on whether all the bits included in the internal read data IDRD<1:2L> are the same logic level (211). That is to say, the flag generation circuit 123 generates the flag FLAG which is activated, when all the bits included in the internal read data IDRD<1:2L> are at the same logic level as one another, and generates the flag FLAG which is inactivated, when at least one bit among the bits included in the internal read data IDRD<1:2L> is a different logic level than any other bit included in the internal read data IDRD<1:2L>. The data strobe signal generation circuit 125 generates the data strobe signal DQS which toggles, in a state in which the flag FLAG is activated, and generates the data strobe signal DQS which does not toggle and maintains a constant logic level, in a state in which the flag FLAG is inactivated. The external device 11 checks whether the memory device 13 has a failure, by checking whether the data strobe signal DQS output through the data strobe pad 107 toggles (213). For example, when the data strobe signal DQS output from the memory device 13 toggles, the external device 11 confirms, through the data strobe signal DQS, a state in which the memory device 13 does not have a failure (215). When the data strobe signal DQS output from the memory device 13 does not toggle, the external device 11 confirms, through the data strobe signal DQS, a state in which the memory device 13 has a failure (217).

As illustrated in FIGS. 5 and 8, when the activated read signal RD is input as the read operation is performed, the data output circuit 121 generates the read data DRD<1:L> by buffering the internal read data IDRD<1:L> and outputs the generated read data DRD<1:L> to the data pad 105 (219). The number of bits included in the read data DRD<1:L> output to the data pad 105 may be variously set depending on an embodiment. For example, when the activated read signal RD is input as the read operation is performed, the data output circuit 121 outputs the read data DRD<1:L> in which only some bits among the bits included in the internal read data IDRD<1:2L> output from the data storage circuit 115 are included. The read data DRD<1:L> are output to the second pad part of the first pad part and the second pad part included in the data pad 105, The external device 11 may check whether the memory device 13 has a failure, by checking whether logic levels of the bits included in the read data DRD<1:L> output through the second pad part of the data pad 105 are the same as logic levels of bits included in the first write data DWT1<1:L> applied to the memory device 13 in the write operation (221). For example, when logic levels of the bits included in the first write data DWT1<1:L> applied to the memory device 13 are the same as logic levels of the bits included in the read data DRD<1:L>, the external device 11 confirms that the memory device 13 does not have a failure (215). When logic levels of the bits included in the first write data DWT1<1:L> are different from logic levels of the bits included in the read data DRD<1:L>, the external device 11 confirms that the memory device 13 has a failure (217). In an embodiment, when logic levels of the bits included in the first write data DWT1<1:L> applied to the memory device 13 are all the same as logic levels of the bits included in the read data DRD<1:L>, the external device 11 confirms that the memory device 13 does not have a failure (215). In an embodiment, when one or more logic levels of the bits included in the first write data DWT1<1:L> are different from logic levels of the bits included in the read data DRD<1:L>, the external device 11 confirms that the memory device 13 has a failure (217).

As illustrated in FIGS. 5 and 8, after confirming that the memory device 13 has a failure, the external device 11 checks whether the address ADD applied to the memory device 13 is an address for accessing a last memory cell array to be tested (223). In a state in which a test for all the memory cell arrays included in the data storage circuit 115 is not completed, the external device 11 changes the address ADD applied to the memory device 13, to test a next memory cell array (225), and repeats the test operation for the next memory cell array (201 to 221), When the test for all the memory cell arrays included in the data storage circuit 115 is completed, the test operation is ended (227).

As is apparent from the above description, the memory device 13 in accordance with an embodiment of the disclosure may generate the data strobe signal DQS, of which the toggling the data strobe signal DQS is controlled depending on whether the memory device 13 has a failure, by sequentially performing the write operation and the read operation in the test operation, and may output the generated data strobe signal DQS to the external device 11. As a consequence, the external device 11 may check whether the memory device 13 has a failure, by checking whether the data strobe signal DQS toggles. In addition, the memory device 13 in accordance with an embodiment of the disclosure may generate the first internal write data IDWT1<11> and the second internal write data IDWT2<1:L> by using the first write data DWT1<1:L> when performing the write operation in the test operation, whereby it may be possible to reduce the number of pads to be used in the write operation.

While various embodiments have been described above, it will be understood to those skilled in the art that the embodiments described are by way of example only. Accordingly, the memory device and memory system for executing a test described herein should not be limited based on the described embodiments.

What is claimed is:

1. A memory device comprising:
an input driver configured to generate first internal write data from first write data based on a write signal;
a test input driver comprising:
a multiplexer configured to output selection data by selecting one of the first write data and second write data based on a test control signal; and
a write buffer configured to generate second internal write data by buffering the selection data based on the write signal; and
a data storage circuit configured to store the first internal write data and the second internal write data in a memory cell array which is accessed by an internal address based on the write signal, and output, when a read operation is performed, data stored in the memory cell array which is accessed by the internal address, as internal read data; and
a flag generation circuit configured to generate a flag for controlling generation of a data strobe signal, based on the internal read data.

2. The memory device according to claim 1, wherein the test input driver generates the second internal write data from the second write data which is input to a pad separate from a pad to which the first write data is input, based on the write signal and the test control signal.

3. The memory device according to claim 1, further comprising:
a command decoder configured to generate a test activation signal which is activated for a test operation and the write signal which is activated for a write operation, by decoding a command.

4. The memory device according to claim 1, further comprising:
a test control circuit configured to generate the test control signal which is activated when the test activation signal is activated.

5. The memory device according to claim 1,
wherein the flag generation circuit generates the flag all based on the comparison results of the bits included in the internal read data.

6. The memory device according to claim 1, further comprising:
a data strobe signal generation circuit generates the data strobe signal which toggles, when the flag is activated, and sets the data strobe signal to maintain a constant logic level, when the flag is inactivated.

7. The memory device according to claim 1, further comprising:
a data strobe signal generation circuit generates the data strobe signal which toggles, when the flag is activated, and blocks an operation of generating the data strobe signal, when the flag is inactivated.

8. The memory device according to claim 1, further comprising:
a data output circuit configured to output the internal read data as read data to a data pad when the read operation is performed, and
wherein setting the data strobe signal to maintain a constant logic level or blocking an operation of generating the data strobe signal, when the flag is inactivated, prevents the read data from being received by an external device.

9. The memory device according to claim 8, wherein the data output circuit outputs the internal read data as read data through at least one pad among pads included in the data pad.

* * * * *